United States Patent
Ross et al.

(10) Patent No.: US 10,630,237 B2
(45) Date of Patent: Apr. 21, 2020

(54) HIGH-VOLTAGE STANDING-WAVE OSCILLATOR

(71) Applicants: Tyler Neil Ross, Ottawa (CA); Kimia Taghizadeh Ansari, Ottawa (CA)

(72) Inventors: Tyler Neil Ross, Ottawa (CA); Kimia Taghizadeh Ansari, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 44 days.

(21) Appl. No.: 15/974,497

(22) Filed: May 8, 2018

(65) Prior Publication Data

US 2019/0348948 A1 Nov. 14, 2019

(51) Int. Cl.
*H03B 5/18* (2006.01)
*H03B 5/12* (2006.01)

(52) U.S. Cl.
CPC ......... *H03B 5/1852* (2013.01); *H03B 5/1212* (2013.01); *H03B 5/1228* (2013.01); *H03B 2200/0024* (2013.01)

(58) Field of Classification Search
CPC ............... H03B 5/1852; H03B 5/1841; H03B 2200/0024; H03B 5/1228; H03B 5/1212; H03B 5/1215; H03B 5/1243
See application file for complete search history.

(56) References Cited

U.S. PATENT DOCUMENTS

| | | | |
|---|---|---|---|
| 5,486,793 A | 1/1996 | Hill | |
| 7,091,802 B2 * | 8/2006 | Ham | H01P 3/026 331/99 |
| 7,538,603 B2 * | 5/2009 | Ikeda | H03B 5/1841 327/565 |
| 8,633,774 B2 | 1/2014 | Wood | |
| 8,866,558 B2 * | 10/2014 | Li | H03B 5/1228 331/107 SL |
| 2002/0097100 A1 | 7/2002 | Woods et al. | |
| 2010/0123523 A1 | 5/2010 | Walsworth et al. | |
| 2013/0181782 A1 | 7/2013 | Koyama et al. | |

FOREIGN PATENT DOCUMENTS

CN 102362428 A 2/2012
WO 2005011101 A2 2/2005

OTHER PUBLICATIONS

Sasaki, Mamoru, et al. "17GHz fine grid clock distribution with uniform-amplitude standing-wave oscillator." 2006 Symposium on VLSI Circuits, 2006. Digest of Technical Papers . . . IEEE, 2006. (Year: 2006).*

(Continued)

*Primary Examiner* — Ryan Johnson

(57) ABSTRACT

A standing wave oscillator is described. The standing wave oscillator includes a transmission line, and an even number of gain stages. Each gain stage is connected to the transmission line, and each gain stage is located at a respective location along a length of the transmission line. The gain stages are configured to generate a standing wave oscillator signal along the length of the transmission line, when a supply voltage is applied to at least one end of the transmission line. The location of each gain stage is non-coincidental with an expected location of maximum amplitude of the standing wave oscillator signal.

20 Claims, 11 Drawing Sheets

(56) References Cited

OTHER PUBLICATIONS

Chen, Yen-Ju, and Ta-Shun Chu. "A two-dimensional direct-coupled standing-wave oscillator array." 2013 IEEE MTT-S International Microwave Symposium Digest (MTT). IEEE, 2013. (Year: 2013).*
Chien, Jun-Chau, and Liang-Hung Lu. "Design of wide-tuning-range millimeter-wave CMOS VCO with a standing-wave architecture." IEEE Journal of Solid-State Circuits 42.9 (2007): 1942-1952. (Year: 2007).*
Huang, Tzuen-Hsi, and Pen-Li You. "27-GHz low phase-noise CMOS standing-wave oscillator for millimeter wave applications." 2008 IEEE MTT-S International Microwave Symposium Digest. IEEE, 2008. (Year: 2008).*
O'Mahony et al., "A 10-GHz Global Clock Distribution Using Coupled Standing-Wave Oscillators", IEEE Journal of Solid-State Circuits, vol. 38, No. 11, pp. 1813-1820, Nov. 2003.
Andress et al., "Standing Wave Oscillators Utilizing Wave-Adaptive Tapered Transmission Lines", IEEE Journal of Solid-State Circuits, vol. 40, No. 3, pp. 638-651, Mar. 2005.
Chen et al., "2-D Direct-Coupled Standing-Wave Oscillator Arrays", IEEE Transactions on Microwave Theory and Techniques, vol. 61, No. 12, pp. 4472-4482, Dec. 2013.
Ham et al., "A Circular Standing Wave Oscillator", ISSCC 2004, 2004 IEEE International Solid-State Circuits Conference, Feb. 18, 2004.

\* cited by examiner

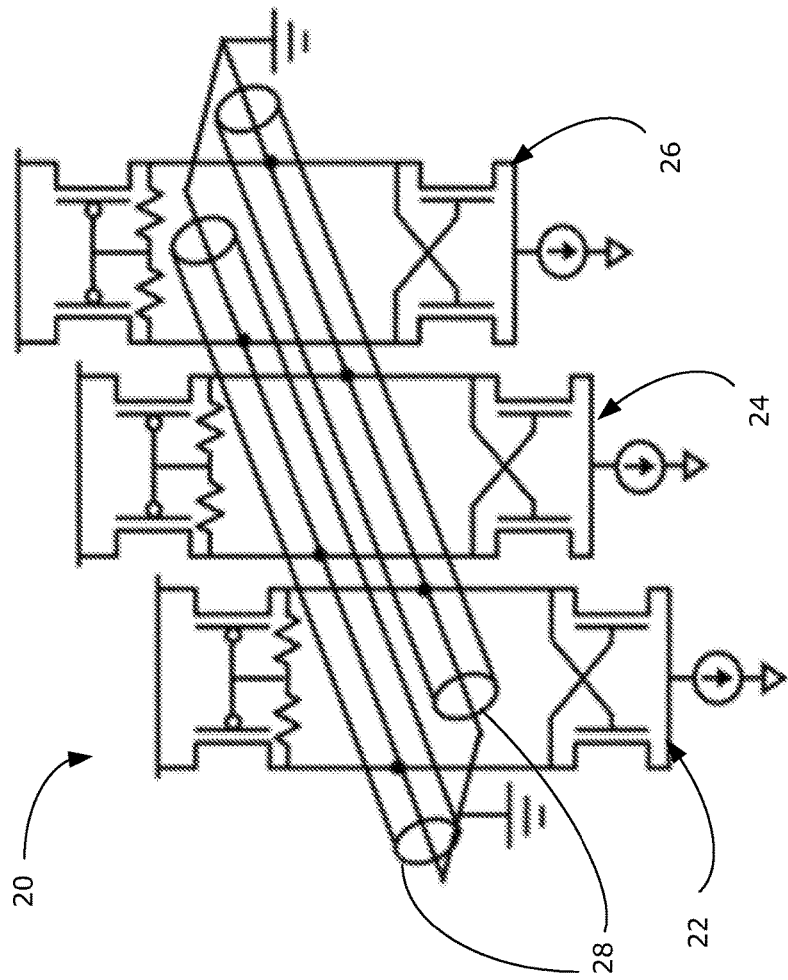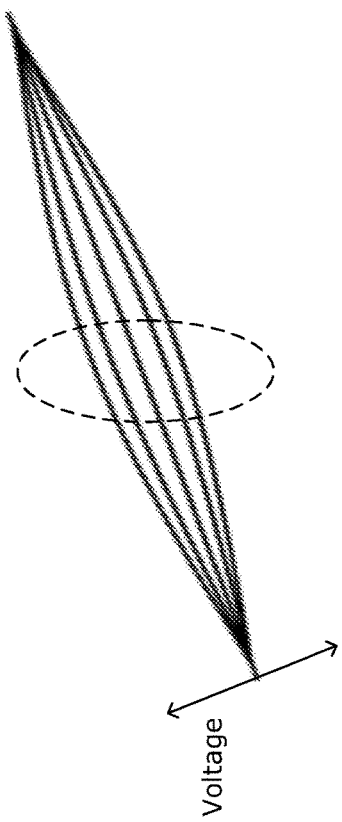
FIG. 2A
Prior art
FIG. 2B
Prior art

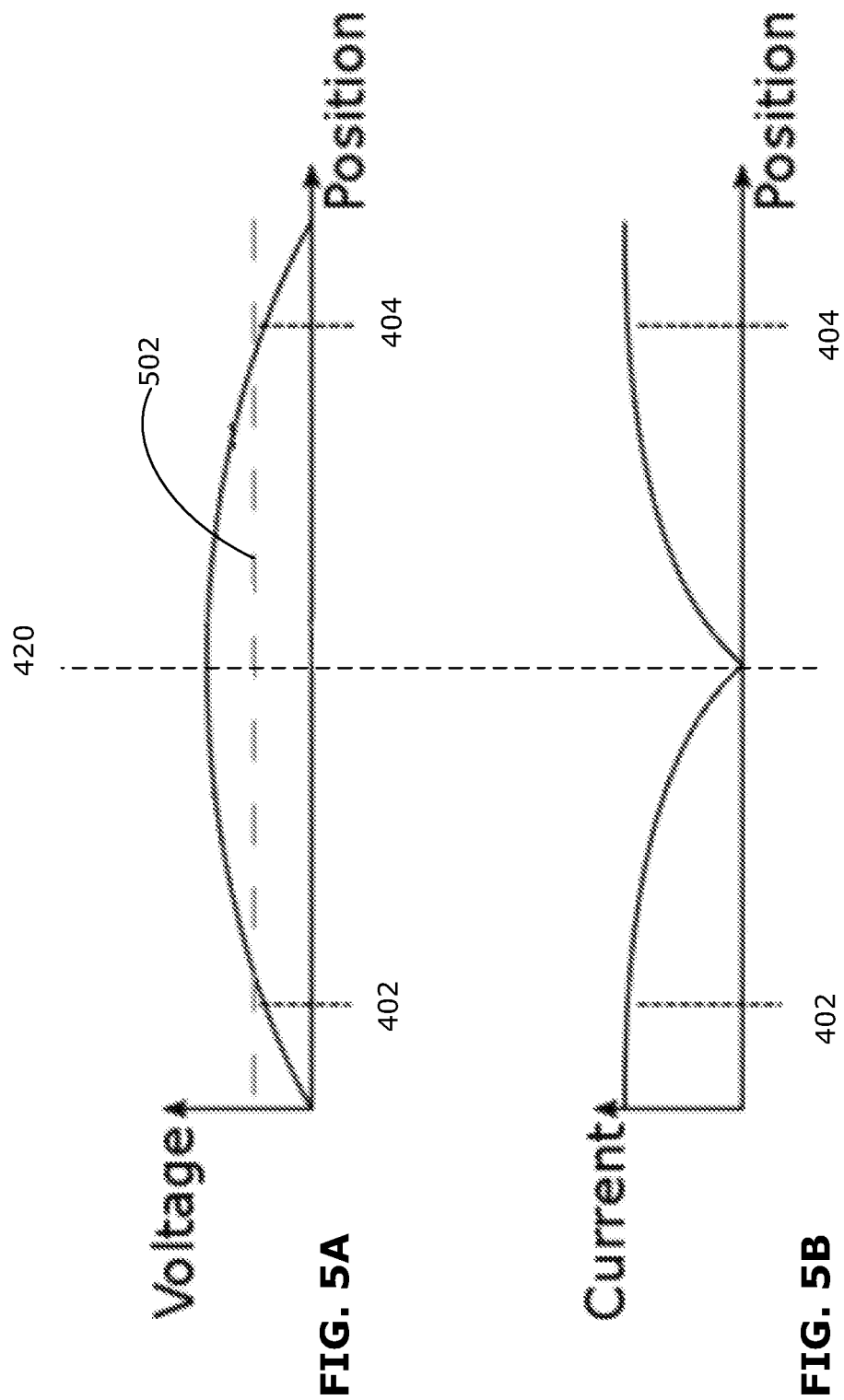

HIGH-VOLTAGE STANDING-WAVE OSCILLATOR

FIELD

The present disclosure relates to standing wave oscillators, including oscillators suitable for use in communication devices.

BACKGROUND

Oscillators are used in various communications devices, including both wired and wireless communication devices. With increasing demand for improved performance in communication devices, including more stringent requirements for signal integrity and modulation specifications, there is also increasing demand for better performance of oscillators, including better phase noise performance. One approach for reducing phase noise in an oscillator is to increase the amount of energy stored in the resonator. However, in conventional oscillator design, the voltage swing (which increases with stored energy) rises with the bias current in the current limiting region, and this voltage swing growth is typically limited by the breakdown voltage of an active device (e.g., transistor) that is directly connected to the resonator.

There is also a trend towards higher frequencies for communication signals, and a trend towards integration of radio frequency (RF) and digital components. These trends tend to favor smaller circuitry operating at lower voltages, particularly as supply voltages are tending to decrease (e.g., to 1V or less). As a result, the energy that can be stored in an oscillator resonator is decreased, leading to worse phase noise.

There is a desire to provide an oscillator that is able to provide improvements in phase noise.

SUMMARY

The present disclosure describes examples of a standing wave oscillator that can provide improved phase noise, by avoiding the limitations of breakdown of the transistors. By designing the oscillator to avoid locating a transistor near where the maximum amplitude of the oscillator signal is expected to occur, the oscillator can be operated at a higher voltage swing without being limited by the breakdown voltage of the transistor.

In some examples, the present disclosure describes a standing wave oscillator including a transmission line and an even number of gain stages. Each gain stage is connected to the transmission line, and each gain stage is located at a respective location along a length of the transmission line. The gain stages are configured to generate a standing wave oscillator signal along the length of the transmission line, when a supply voltage is applied to at least one end of the transmission line. The location of each gain stage is non-coincidental with an expected location of maximum amplitude of the standing wave oscillator signal.

In any of the preceding aspects/embodiments, the standing wave oscillator may include a pair of transmission lines, wherein each gain stage may be connected across the pair of transmission lines, and wherein the pair of transmission lines may be virtually grounded at each end.

In any of the preceding aspects/embodiments, each gain stage may be located along the transmission line where an expected amplitude of the standing wave oscillator signal, when a selected supply voltage is applied, is below a breakdown voltage of one or more transistors in each gain stage.

In any of the preceding aspects/embodiments, an equal number of one or more gain stages may be located on either side of a central line of the standing wave oscillator.

In any of the preceding aspects/embodiments, the gain stages may be located symmetrically on either side of the central line of the standing wave oscillator, and the central line may be coincidental with the expected location of maximum amplitude of the standing wave oscillator signal.

In any of the preceding aspects/embodiments, there may be two gain stages.

In any of the preceding aspects/embodiments, there may be four gain stages.

In any of the preceding aspects/embodiments, the gain stages may be all identical in circuit design.

In any of the preceding aspects/embodiments, the transmission line may be implemented as an LC ladder.

In any of the preceding aspects/embodiments, the standing wave oscillator may include a varactor diode located at the expected location of the maximum amplitude of the standing wave oscillator signal.

In some aspects, the present disclosure describes a communication device including a transceiver for receiving or transmitting a communication signal, a mixer for mixing the communication signal with an oscillator signal, a standing wave oscillator for providing the oscillator signal to the mixer. The oscillator signal is tapped from a selected location along the standing wave oscillator. The standing wave oscillator includes a transmission line, and an even number of gain stages. Each gain stage is connected to the transmission line, and each gain stage is located at a respective location along a length of the transmission line. The gain stages are configured to generate a standing wave oscillator signal along the length of the transmission line, when a supply voltage is applied to at least one end of the transmission line. The location of each gain stage is non-coincidental with an expected location of maximum amplitude of the standing wave oscillator signal.

In any of the preceding aspects/embodiments, the standing wave oscillator may include a pair of transmission lines, wherein each gain stage may be connected across the pair of transmission lines, and wherein the pair of transmission lines may be virtually grounded at each end.

In any of the preceding aspects/embodiments, each gain stage may be located along the transmission line where an expected amplitude of the standing wave oscillator signal, when a selected supply voltage is applied, is below a breakdown voltage of one or more transistors in each gain stage.

In any of the preceding aspects/embodiments, an equal number of one or more gain stages may be located on either side of a central line of the standing wave oscillator.

In any of the preceding aspects/embodiments, the gain stages may be located symmetrically on either side of the central line of the standing wave oscillator, and the central line may be coincidental with the expected location of maximum amplitude of the standing wave oscillator signal.

In any of the preceding aspects/embodiments, there may be two gain stages in the standing wave oscillator.

In any of the preceding aspects/embodiments, there may be four gain stages in the standing wave oscillator.

In any of the preceding aspects/embodiments, the gain stages may be all identical in circuit design.

In any of the preceding aspects/embodiments, the transmission line may be implemented as an LC ladder.

In any of the preceding aspects/embodiments, the standing wave oscillator may include a varactor diode located at the expected location of the maximum amplitude of the standing wave oscillator signal.

BRIEF DESCRIPTION OF THE DRAWINGS

Reference will now be made, by way of example, to the accompanying drawings which show example embodiments of the present application, and in which:

FIG. 2A is a schematic diagram of an example prior art standing wave oscillator;

FIG. 2B is a representation of voltage amplitudes in the prior art oscillator of FIG. 2A;

FIG. 5A is a representation of example voltage amplitudes in the example oscillator of FIG. 4;

FIG. 5B is a representation of example current amplitudes in the example oscillator of FIG. 4;

Similar reference numerals may have been used in different figures to denote similar components.

DESCRIPTION OF EXAMPLE EMBODIMENTS

Oscillators are used by various communication devices, including wired or wireless communication devices. A typical radio frequency (RF) transceiver in a communication device requires oscillators to operate (e.g., use in clock distribution, for up-conversion or down-conversion of RF antenna signals), and improvements in phase noise of the oscillators typically lead to improved performance of the transceiver overall. A standing wave oscillator is a type of oscillator with a distributed resonator, and such a design is often found in communication devices.

Figure 1:
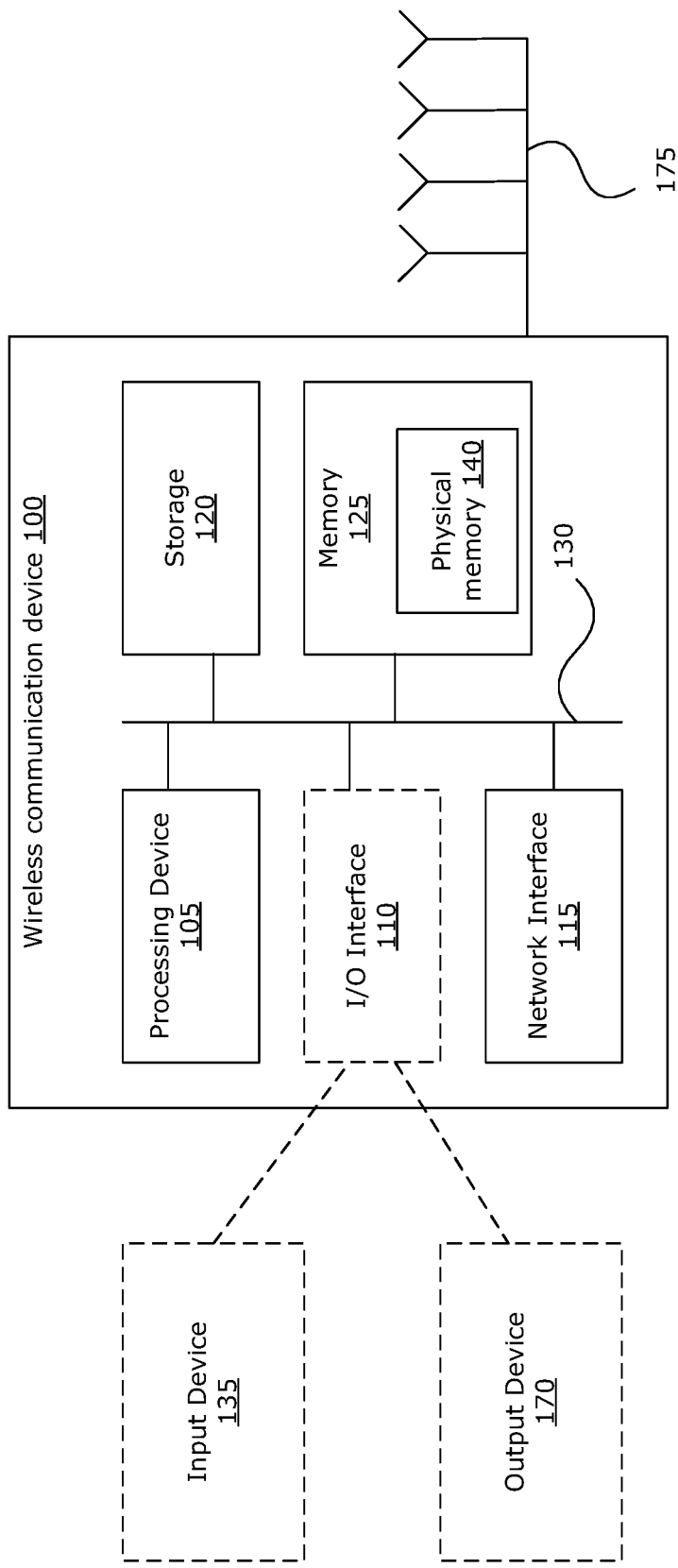
FIG. 1 is a schematic diagram of an example wireless communication device, in which an example of the disclosed oscillator may be implemented.

FIG. 1 is a schematic diagram of an example wireless communication device 100, in which example oscillators described herein may be used. Examples of the oscillators described herein may be used in a receiver, transmitter or transceiver of the wireless communication device 100. For example, the wireless communication device 100 may be an electronic device, such as a user equipment (UE) or a base station, in a wireless communication network. The wireless communication device 100 may be used for communications within 5G communication networks or other wireless communication networks. Other communication devices (including communication devices for wired or wireless communications) may also be suitable for implementing examples described herein, and which may include components different from those described with respect to FIG. 1. Although FIG. 1 shows a single instance of each component, there may be multiple instances of each component in the wireless communication device 100. The wireless communication device 100 may be implemented using parallel and/or distributed architecture.

The wireless communication device 100 may include one or more processing devices 105, such as a processor, a microprocessor, an application-specific integrated circuit (ASIC), a field-programmable gate array (FPGA), a dedicated logic circuitry, or combinations thereof. The wireless communication device 100 may also include one or more optional input/output (I/O) interfaces 110, which may enable interfacing with one or more optional input devices 135 and/or output devices 170. The wireless communication device 100 may include one or more network interfaces 115 for wired or wireless communication with a network (e.g., an intranet, the Internet, a P2P network, a WAN and/or a LAN, and/or a Radio Access Network (RAN)) or other node. The network interface(s) 115 may include one or more interfaces to wired networks and wireless networks. Wired networks may make use of wired links (e.g., Ethernet cable). Wireless networks, where they are used, may make use of wireless connections over a plurality of antennas 175. The network interface(s) 115 may provide wireless communication via one or more transmitters or transmit antennas and one or more receivers or receive antennas, for example. A standing wave oscillator, as disclosed herein, may be used to provide an oscillator signal for mixing antenna signals. In this example, a plurality of antennas 175 is shown. The plurality of antennas 175 may serve as an antenna array. In other examples, the wireless communication device 100 may use one antenna 175, which may provide both receiving and transmitting functions. The wireless communication device 100 may also include one or more storage units 120, which may include a mass storage unit such as a solid state drive, a hard disk drive, a magnetic disk drive and/or an optical disk drive.

The wireless communication device 100 may include one or more memories 125 that can include a physical memory 140, which may include a volatile or non-volatile memory (e.g., a flash memory, a random access memory (RAM), and/or a read-only memory (ROM)). The non-transitory memory(ies) 125 (as well as storage 120) may store instructions for execution by the processing device(s) 105. The memory(ies) 125 may include other software instructions, such as for implementing an operating system (OS), and other applications/functions. In some examples, one or more data sets and/or modules may be provided by an external memory (e.g., an external drive in wired or wireless communication with the wireless communication device 100) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 130 providing communication among components of the wireless communication device 100. The bus 130 may be any suitable bus architecture including, for example, a memory bus, a peripheral bus or a video bus. Optional input device(s) 135 (e.g., a keyboard, a mouse, a microphone, a touchscreen, and/or a keypad) and optional output device(s) 170 (e.g., a display, a speaker and/or a printer) are shown as external to the wireless communication device 100, and connected to optional I/O interface 110. In other examples, one or more of the input device(s) 135 and/or the output device(s) 170 may be included as a component of the wireless communication device 100.

The oscillator described herein may be included as a component of the wireless communication device 100, for example as a component of a receiver, transmitter or transceiver for receiving/transmitting wireless signals using the antennas 175. The processing device(s) 105 may also be used to control operation of the oscillator, for example by tuning the oscillator via control of a varactor diode, as discussed further below.

To assist in understanding the present disclosure, some examples of prior art oscillator designs are discussed. FIG. 2A is a schematic diagram of an example prior art standing wave oscillator 20, as described by O'Mahony et al. (IEEE JSSC, 2003). In this example, the standing wave oscillator 20 has three gain stages 22, 24, 26 connected across a pair of differential transmission lines 28. One gain stage 24 is located at the middle of the oscillator 20, with the gain stages 22, 26 located symmetrically on either side. The gain stages 22, 24, 26 employ transistors and may have similar design. For example, the gain stages 22, 24, 26 may be each implemented using cross-coupled metal-oxide-semiconductor field-effect transistors (MOSFETs) and PMOS current sources, as shown. The voltage across the pair of differential transmission lines 28 is taken as the oscillator signal, and the oscillator 20 may be tapped at different points along its length to obtain the oscillator signal. FIG. 2B is a graphical representation of voltage amplitudes expected along the standing wave oscillator 20, during operation.

As can be appreciated, the maximum amplitude of the oscillator voltage (indicated by dashed circle in FIG. 2B) occurs where a gain stage 24 is located. A voltage that is too high at this point will result in the transistors of the gain stage 24 experiencing voltages over their breakdown voltages (e.g., drain-source voltage above the breakdown threshold, where the transistors are metal-oxide-semiconductor field-effect transistor (MOSFETs)), resulting in damage to the transistors. Thus, the maximum amplitude of the oscillator signal is limited by the breakdown voltages of the transistors in the gain stage 24.

Figure 3A:
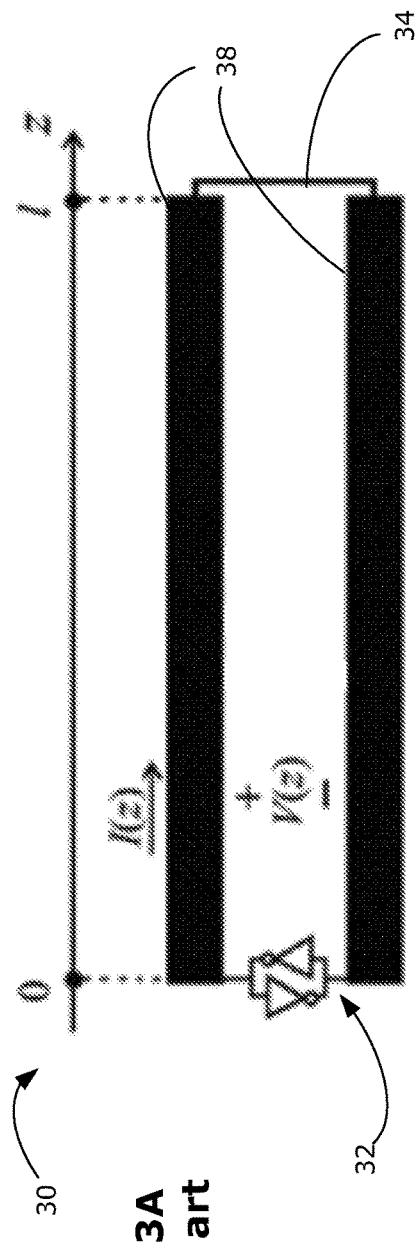
FIG. 3A is a schematic diagram of another example prior art standing wave oscillator.
Figure 3B:
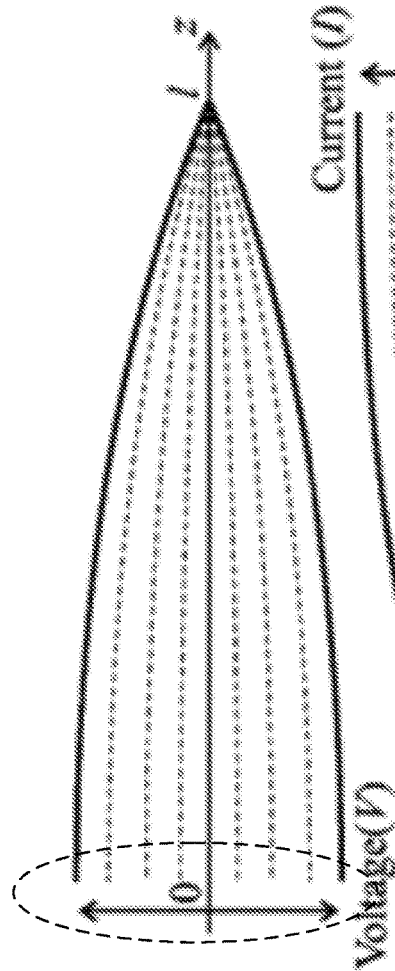
FIG. 3B is a representation of voltage amplitudes in the prior art oscillator of FIG. 3A.
Figure 3C:
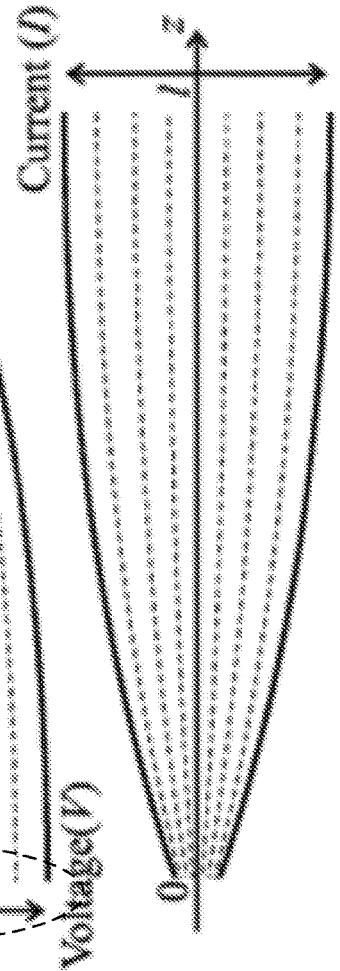
FIG. 3C is a representation of current amplitudes in the prior art oscillator of FIG. 3A.

FIG. 3A is a schematic diagram of another example prior art standing wave oscillator 30, as described by Andress et al. (IEEE JSSC, 2005). In this example, the standing wave oscillator 30 has a single gain stage 32 connected across a pair of differential transmission lines 38. The gain stage 32 is located on one end of the oscillator 30, and a short 34 is located on the opposite end of the oscillator. The gain stage 32 may be implemented using a pair of cross-coupled inverters (e.g., implemented using cross-coupled CMOSs) and may employ transistors. The voltage across the pair of differential transmission lines 38 is taken as the oscillator signal, and may be taken at different locations along the length of the oscillator 30. FIG. 3B is a graphical representation of voltage amplitudes expected during operation of the standing wave oscillator 30, and FIG. 3C is a graphical representation of current amplitudes expected during operation of the standing wave oscillator 30.

Similar to the oscillator 20 of FIG. 2A, in the oscillator 30 of FIG. 3A, the maximum amplitude of the voltage (indicated by dashed circle in FIG. 3B) occurs where the gain stage 32 is located. Thus, the maximum amplitude of the oscillator signal is again limited by the breakdown voltages of the transistors in the gain stage 32.

In both prior art oscillators 20, 30 discussed above, in order to avoid damage to the transistors of the gain stages 24, 32, respectively, the maximum amplitude of the oscillator signal must be maintained below the breakdown voltages of the transistors. This limits the energy that can be stored in the oscillator 20, 30, leading to worse phase noise. Further, in the oscillator 20 of FIG. 2A, the middle gain stage 24 experiences voltages that are different from the other two gain stages 22, 26, despite the gain stages 22, 24, 26 all having the same design. This means that there is imbalance among the gain stages 22, 24, 26, which can lead to deterioration in performance.

Figure 4:
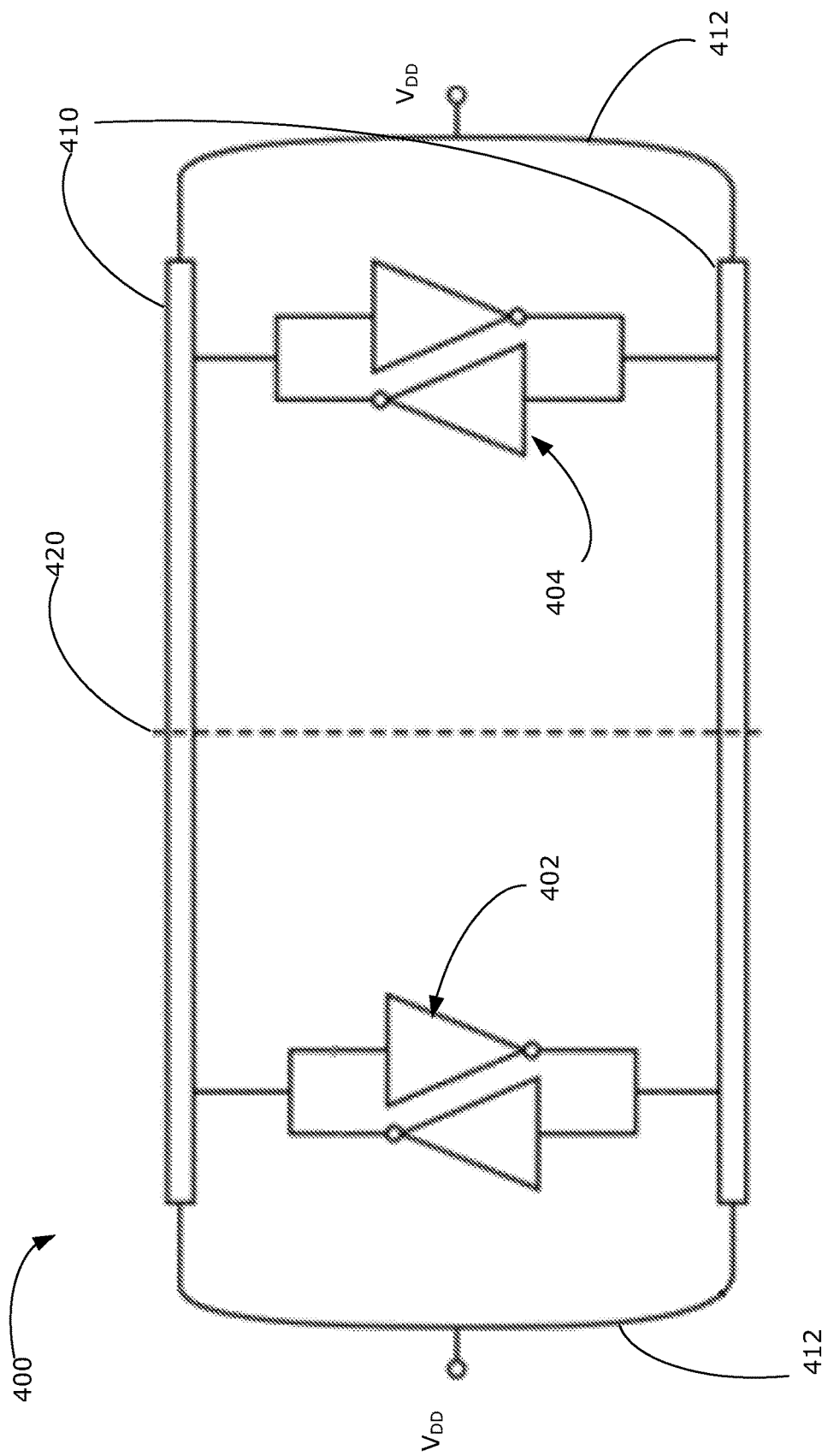
FIG. 4 is a schematic diagram of an example embodiment of the disclosed standing wave oscillator.

FIG. 4 is a schematic diagram of an example disclosed standing wave oscillator 400, which addresses at least some drawbacks of the prior art oscillators discussed above. The oscillator 400 includes an even number of gain stages, for example two gain stages 402, 404, connected across a pair of differential transmission lines 410. In some examples, the oscillator 400 may be implemented using a single transmission line, in a single-ended implementation, as discussed further below. Any even number of gain stages (e.g., four gain stages) may be used. The ends of each of the differential transmission lines 410 are connected together using electrical shorts 412. This results in virtual (AC) grounds at the ends of the transmission lines 410. For example, a supply voltage $V_{DD}$ may be applied at one or both of the shorts 412 to power the oscillator 400. Control of the amplitude of the oscillator signal can be achieved by controlling the bias current applied to each of the gain stages 402, 404. The bias current source, which is also referred to as tail current source in oscillators, may be part of the oscillator topology. For example, each gain stage 402, 404 may include a bias current source, using a suitable gain stage design. Generally, the same bias current is applied to each gain stage 402, 404. The bias current may be adjusted to vary the voltage amplitude of the oscillator signal, up to a maximum voltage that is equal to the supply voltage $V_{DD}$. By changing the supply voltage $V_{DD}$ to the oscillator 400, the maximum possible voltage amplitude of the oscillator signal may be increased or decreased. Generally, the supply voltage $V_{DD}$ is set to be the maximum voltage of the circuit in which the oscillator 400 is implemented. The two gain stages 402, 404 in this example are symmetrically located on either side of a central line 420 of the oscillator 400, where the central line 420 is located at the middle of the length of the oscillator 400. The gain stages 402, 404 may have similar design. The gain stages 402, 404 may employ any suitable transistors in any suitable circuit configuration. For example, each of the gain stages 402, 404 may be implemented as a pair of cross-coupled inverters, as shown. Different circuit implementations of the gain stages 402, 404 may be used. For example, a pair of cross-coupled transistors or two pairs of cross-coupled transistors may be used to implement one gain stage.

FIG. 5A is a representation of example voltage amplitudes in the example oscillator 400 of FIG. 4. FIG. 5B is a representation of example current amplitudes in the example oscillator 400 of FIG. 4. In FIGS. 5A and 5B, the location of the gain stages 402, 404 are indicated on the x-axis. For reference, the central line 420 is also indicated. FIG. 5A also indicates, using a dashed line, the breakdown voltage 502 of the transistors in the gain stages 402, 404. In this example, where the gain stages 402, 404 are located symmetrically on either side of the central line 420, the maximum amplitude of the oscillator voltage signal may be found at the location of the central line 420. Symmetrical placement of the gain stages 402, 404 also results in the gain stages 402, 404 experiencing similar voltages and currents. It should be noted that as voltage increases, current decreases (and vice versa). This indicates that the power on the resonator is constant regardless of where the gain stages 402, 404 are located. That is, even when voltage at the gain stages 402, 404 is lower, there is no change in power.

As can be appreciated, in the example disclosed oscillator 400, the location of the maximum voltage amplitude of the oscillator signal does not coincide with the location of any gain stage. Thus, the maximum oscillator signal is not limited by the breakdown voltage of the transistors in the gain stages 402, 404. As shown in FIG. 5A, the maximum voltage amplitude may be above the breakdown voltage 502, but this maximum voltage amplitude will not be experienced by the gain stages 402, 404. Instead, the gain stages 402, 404 are located at positions where the oscillator signal is expected to be less than the maximum amplitude.

The oscillator 400 may be designed to achieve a phase noise below a desired threshold. Consider the following phase noise equation:

$$L(\omega_m) = \frac{4kTR_pF}{V_o^2}\left(\frac{\omega_o}{2Q\omega_m}\right)^2$$

where $L(\omega_m)$ is the oscillator phase noise for an offset frequency $\omega_m$, Q is the quality factor of the loaded resonator, $\omega_m$ is the offset frequency from output frequency $\omega_o$, F is the noise factor of the oscillator, k is Boltzmann's constant, T is absolute temperature, $R_p$ is the resonator equivalent parallel resistance, and $V_o$ is the output voltage of the oscillator signal.

According to this equation, increasing the output voltage of the oscillator results in a decrease in phase noise. For example, doubling the output voltage $V_o$ results in a 6 dB improvement in phase noise. The output voltage $V_o$ may be increased by increasing the bias current applied to the oscillator, up to a maximum voltage swing of $2V_{DD}$.

The oscillator 400 may be designed to tolerate the maximum voltage amplitude necessary to exhibit phase noise below a desired threshold. This target maximum voltage amplitude does not need to be limited by the breakdown voltages of the transistors in the gain stages 402, 404. For example, given a target maximum voltage amplitude at the central line 420 of the oscillator 400, the gain stages 402, 404 can be located away from the central line 420, such that the expected maximum voltage experienced by the gain stages 402, 404 remains lower than the breakdown voltage 502. For example, the gain stages 402, 404 may be located where the voltage experienced by the gain stages 402, 404 is expected to be at most about 90% of the breakdown voltage 502. The location of the gain stages 402, 404 may be adjusted to place the gain stages 402, 404 closer or farther away from the central line 420, provided the voltage expected to be experienced by the gain stages 402, 404 is below the breakdown voltage 502. Appropriate simulations may be used to place the gain stages 402, 404 at locations that do not coincide with where maximum amplitude of the oscillator signal is expected to be located, and where the expected voltage is less than the breakdown voltage 502.

Thus, the oscillator 400 may be designed to locate the gain stages 402, 404 such that the gain stages 402, 404 are not damaged when the oscillator 400 operates under a given supply voltage $V_{DD}$. At the same time, for a given placement of the gain stages 402, 404, the bias current may be controlled such that the gain stages 402, 404 are not damaged. A combination of circuit design (e.g., selecting desired locations for the gain stages 402, 404) and control of bias current may thus be used to enable the oscillator 400 to generate a sufficiently high output swing (and hence sufficiently low phase noise) and at the same time avoiding damage to the gain stages 402, 404.

Symmetrical location of the gain stages 402, 404 on either side of the central line 420 results in the gain stages 402, 404 operating at substantially the same operating voltages and currents, thus resulting in a balanced circuit. This may help to improve overall performance and/or help to extend the life of the oscillator 400. Symmetrical design of the oscillator 400 may also help to ensure that there is impedance balance between the gain stages 402, 404, such that the maximum of the oscillator signal is located at or close to the central line 420. This may also help to ensure that the amplitude of the standing wave in the oscillator signal is a full 180° half-wave, with respective 90° portions of the standing wave being provided on either side of the central line 420. This may be desirable to ensure that the oscillator 400 provides a full tuning range. In other examples, the gain stages 402, 404 may not be symmetrically located on either side of the central line 420, and the standing wave may be shifted off-center.

The oscillator 400 may be tapped at any location, in order to obtain an oscillator signal at any point on the standing wave. The oscillator 400 may also include a tuning element, such as a varactor diode (not shown) to tune operation of the oscillator 400. Because a varactor diode often possesses a higher breakdown voltage than a transistor, the varactor diode may be placed at the location where the oscillator signal has the greatest amplitude (e.g., at or close to the central line 420). This enables the varactor diode to have greater tuning effect. The use of a varactor diode to tune the oscillator 400, away from a gain stage with transistors, also provides benefit in that the varactor diode's effect is not reduced by parasitic capacitance from the gain stage.

In some examples, an LC ladder may be used to implement the differential transmission lines 410. For example, the oscillator 400 may be designed according to the following equation:

$$f_{osc} = \frac{1}{2l\sqrt{L\left(C_0 + \frac{nC_{seg}}{l}\right)}}$$

where $f_{osc}$ is the desired output frequency of the oscillator, l is the physical length of the oscillator, L is the total inductance of the oscillator, $C_0$ is the total capacitance of the oscillator, n is the number of segments in the LC ladder, and $C_{seg}$ is the capacitance per gain stage.

Figure 6A:
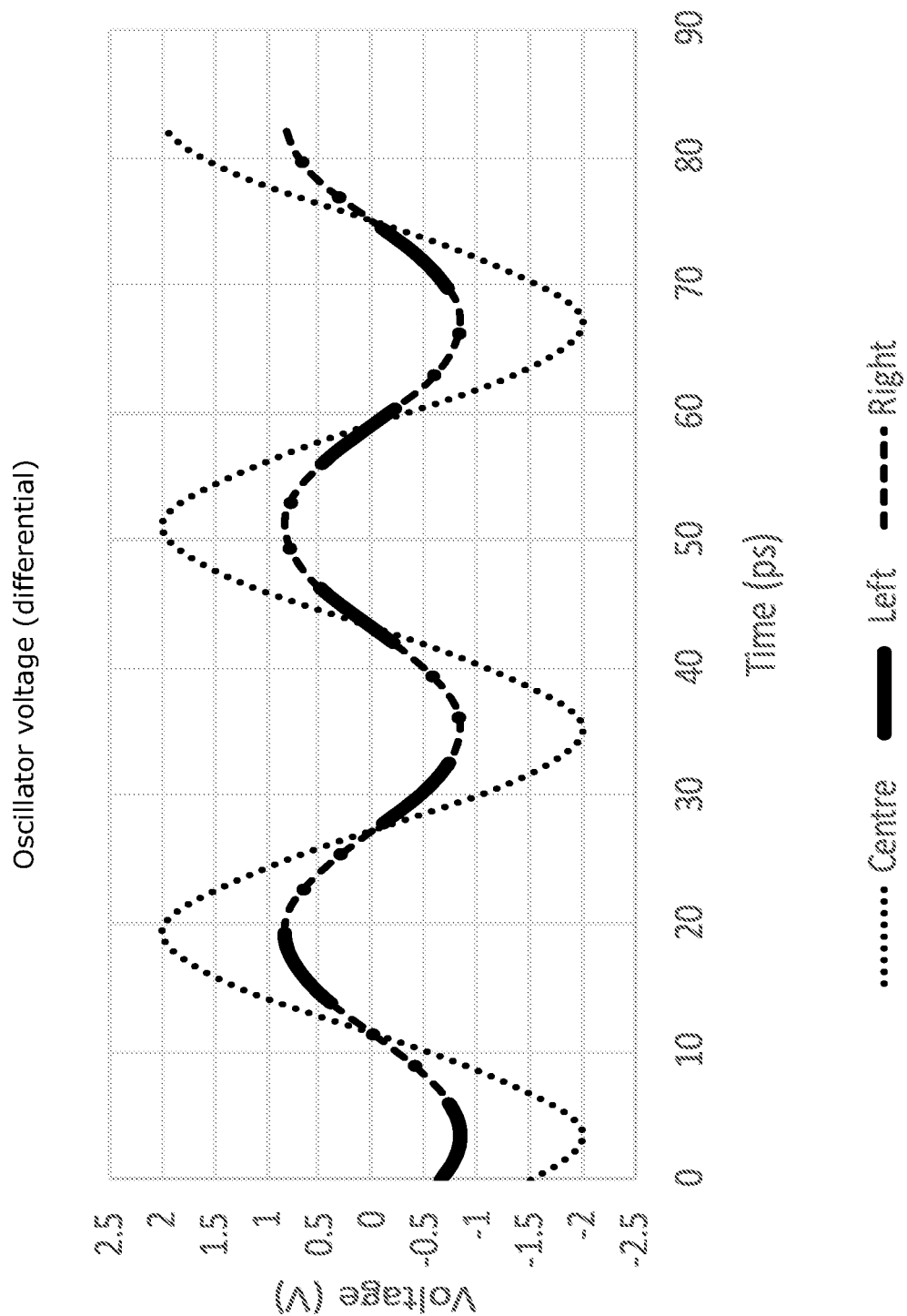
FIG. 6A is a graph of example oscillator voltage signals in the prior art oscillator of FIG. 2A.
Figure 6B:
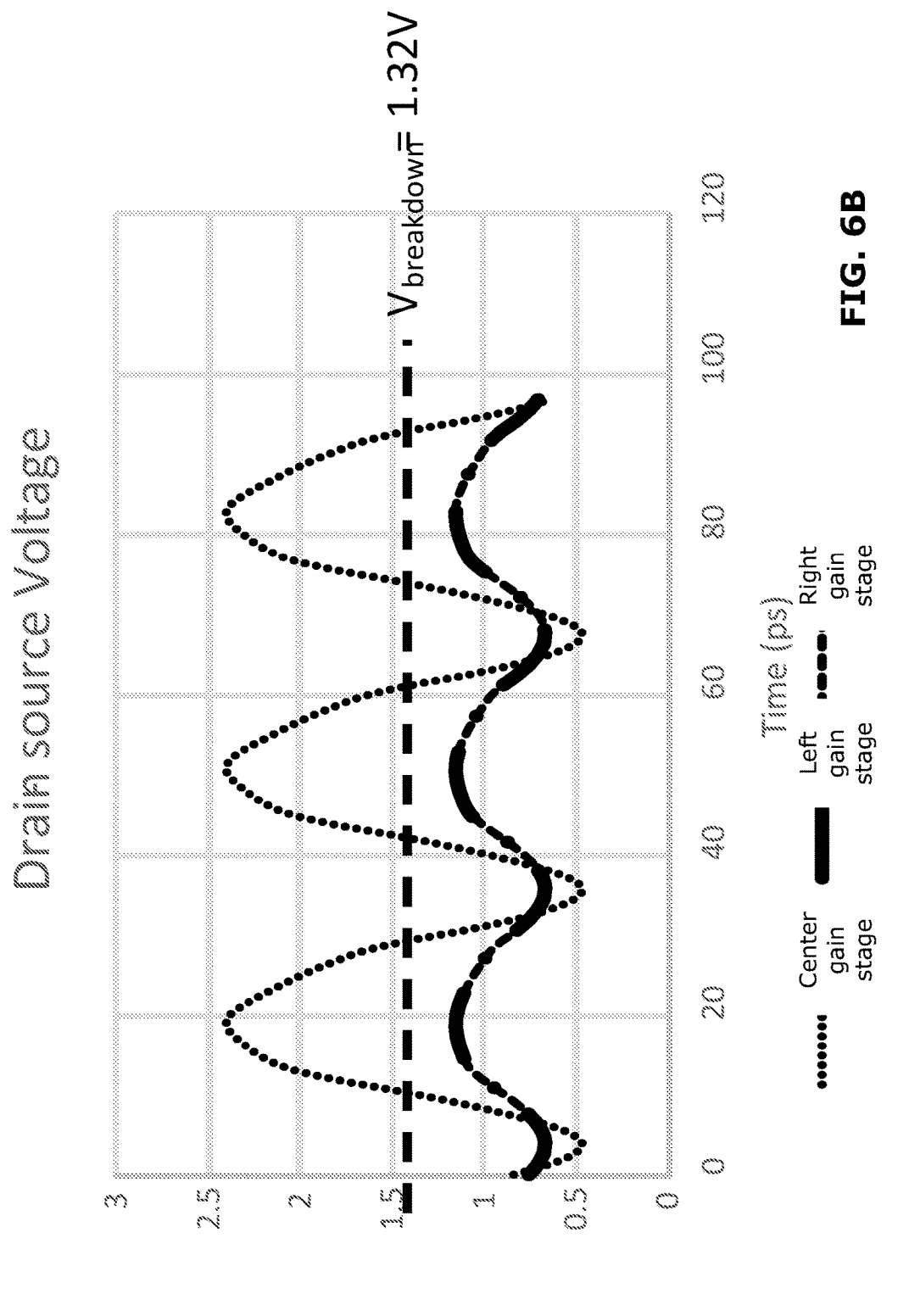
FIG. 6B is a graph of example drain-source voltages in the transistors in the prior art oscillator of FIG. 2A.

Reference is now made to FIGS. 6A-7C, to compare the performance of the prior art oscillator 20 of FIG. 2A with the performance of the example disclosed oscillator 400 of FIG. 4. FIG. 6A is a graph of simulated oscillator voltage signals measured at the locations of the three gain stages (left, center and right corresponding to the locations of gain stages 22, 24, and 26, respectively) in the prior art oscillator 20. FIG. 6B is a graph of simulated drain-source voltages in the transistors of the three gain stages 22, 24, 26 in the prior art oscillator 20. FIG. 6B also indicates the breakdown voltage of 1.32V for the transistors in the gain stages 22, 24, 26. FIG. 7A is a graph of simulated oscillator voltage signals in the example disclosed oscillator 400, measured at left, center and right locations corresponding to the left, center and right locations of the gain stages in the prior art oscillator 20. FIG. 7B is a graph of simulated drain-source voltages in the transistors of the two gain stages (left gain stage 402 and right gain stage 404) in the example disclosed oscillator 400. FIG. 7B also indicates the breakdown voltage of 1.32V for the transistors in the gain stages 402, 404. As seen in FIGS. 6A and 7A, the example disclosed oscillator 400 is able to achieve an oscillator signal having the same voltage amplitude as the prior art oscillator 20. However, as seen in FIG. 6B, at this signal power, the prior art oscillator 20 results in the center gain stage 24 being subjected to voltages above the breakdown voltage of its transistors. In comparison, as seen in FIG. 7B, at the same signal power, the gain stages 402, 404 in the example disclosed oscillator 400 experience voltages safely below the breakdown voltage.

Figure 7A:
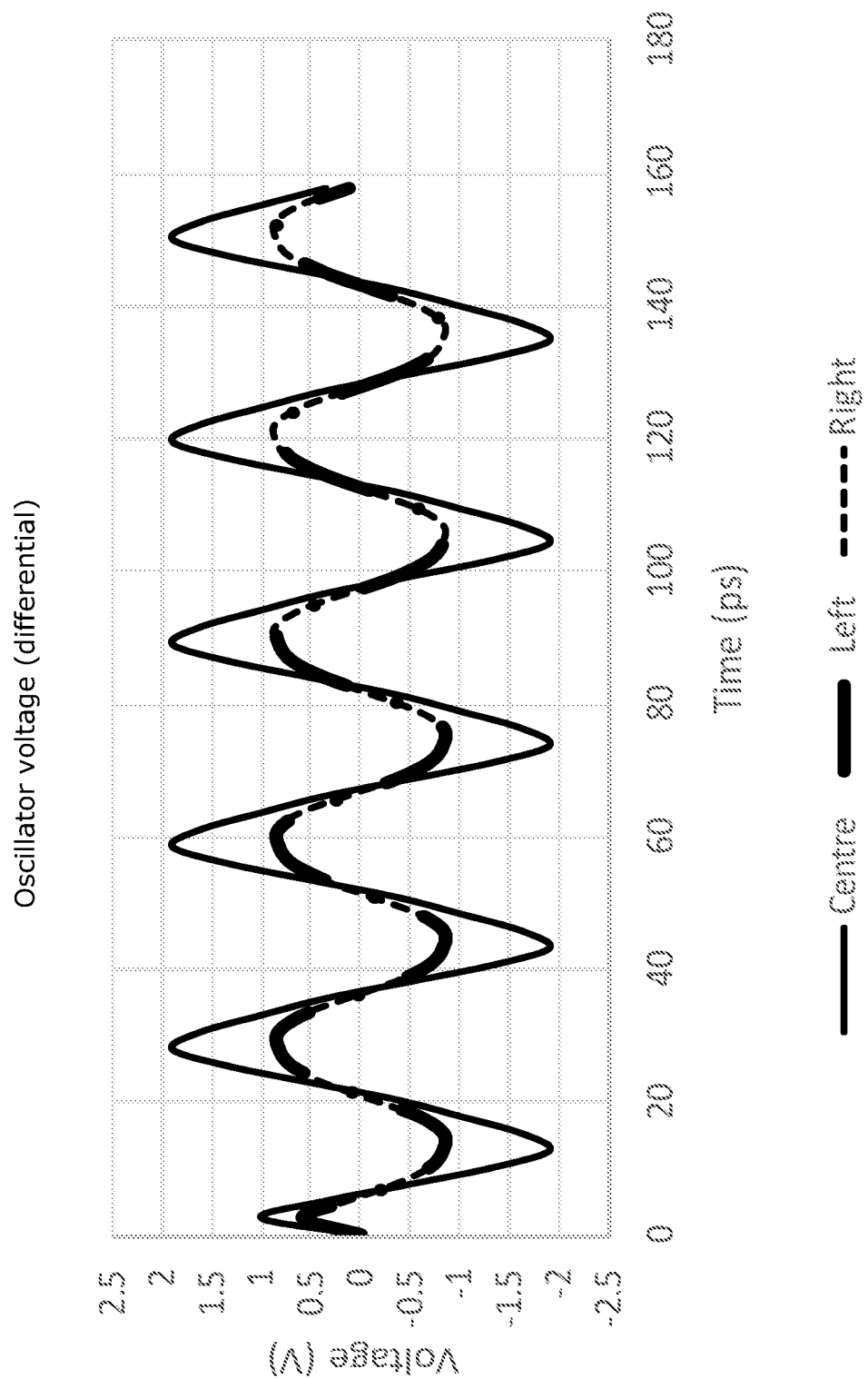
FIG. 7A is a graph of example oscillator voltage signals in the example oscillator of FIG. 4.
Figure 7B:
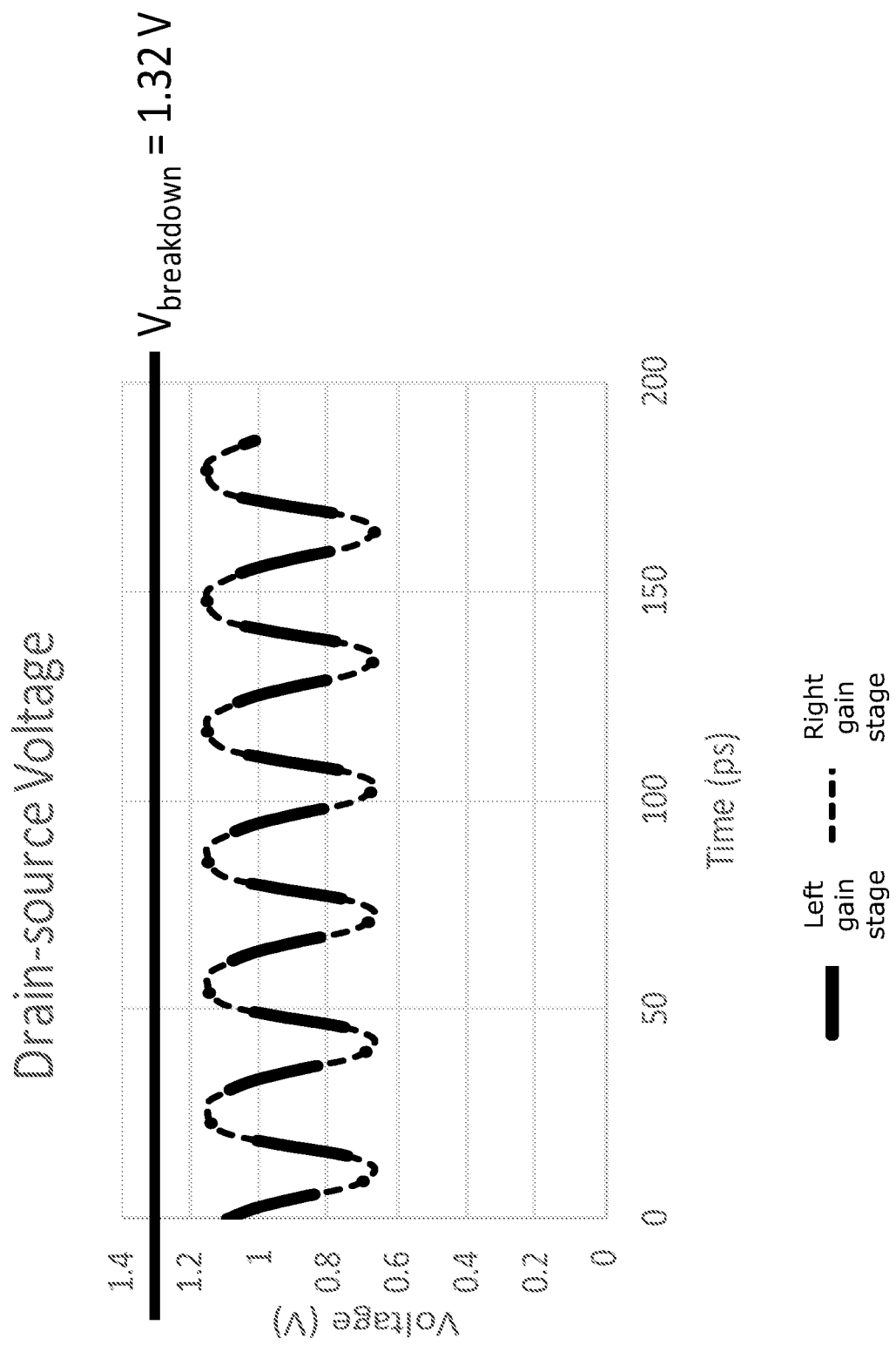
FIG. 7B is a graph of example drain-source voltages in the transistors in the example oscillator of FIG. 4.
Figure 7C:
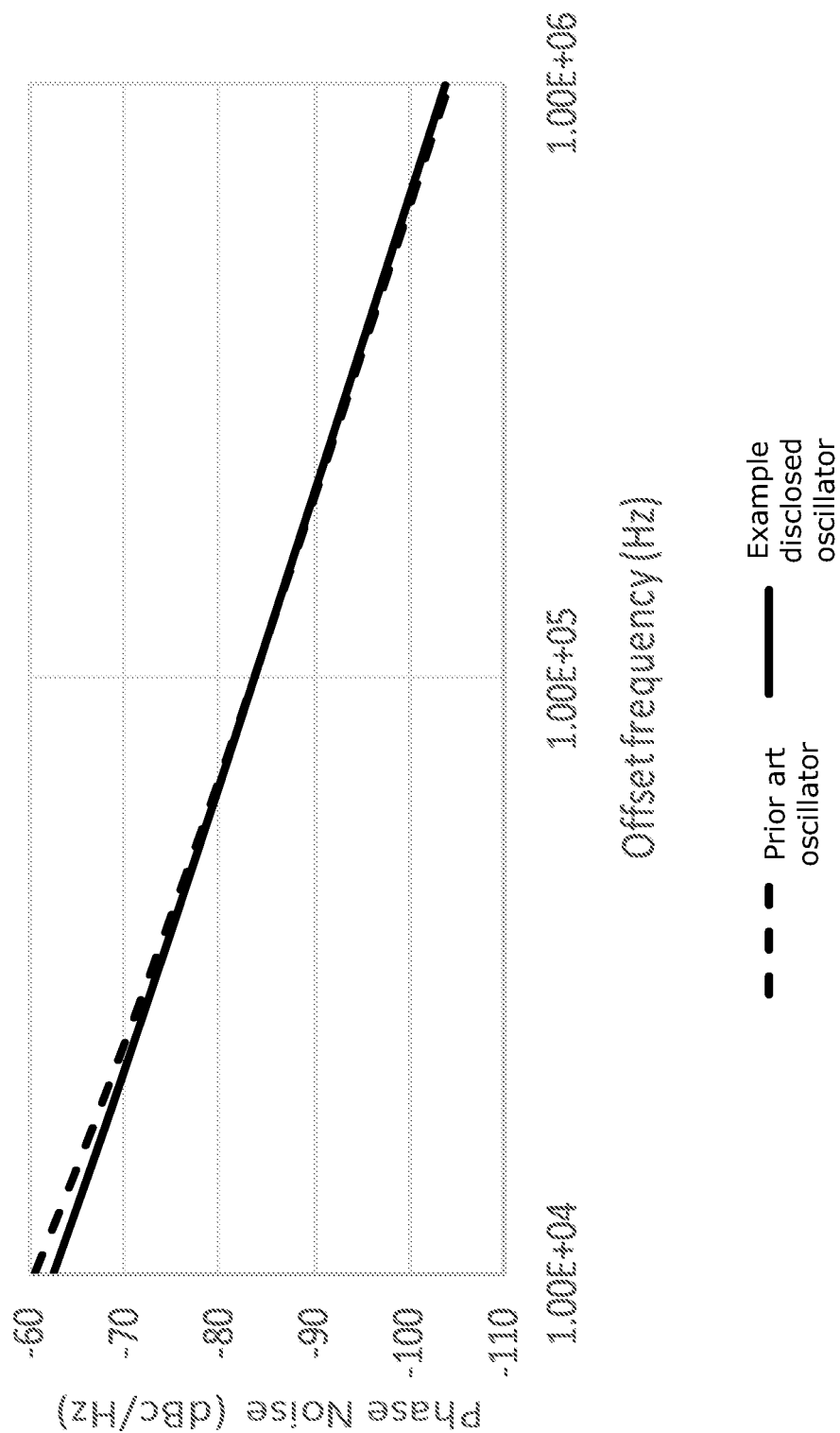
FIG. 7C is a graph of example phase noise in the prior art oscillator of FIG. 2A compared to the example oscillator of FIG. 4.

FIG. 7C is a graph of example phase noise in the prior art oscillator 20 and in the example disclosed oscillator 400, when outputting the same signal power. As can be seen in FIG. 7C, for the same signal power, the example disclosed oscillator 400 achieves a phase noise that is comparable to the prior art oscillator 20. However, the example disclosed oscillator 400 has the advantage that the transistors are not subjected to voltages above their breakdown voltage. In contrast, in order to achieve the same phase noise, the transistors in the center gain stage of the prior art oscillator 20 are subjected to voltages above their breakdown voltage. If the supply voltage to the prior art oscillator 20 is reduced, to prevent transistor damage, then the signal power is decreased and phase noise increased.

Figure 8:
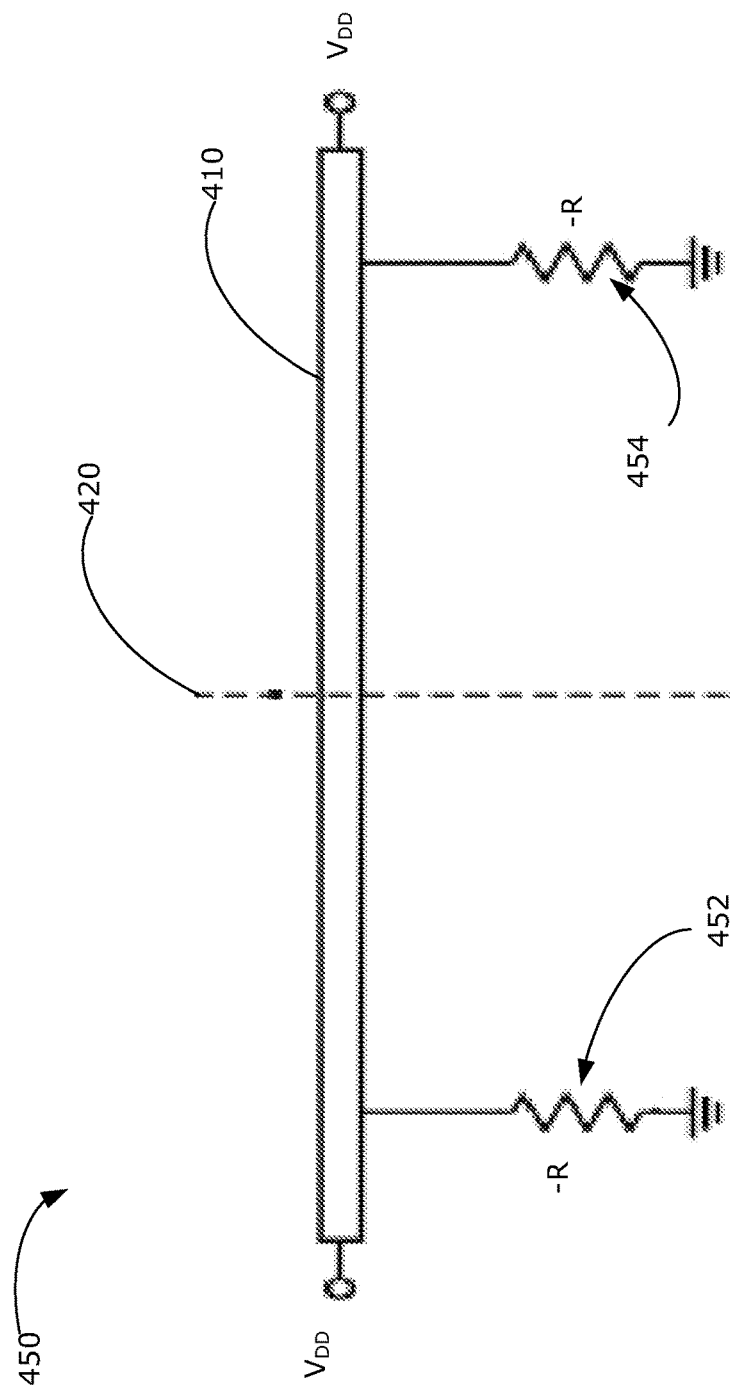
FIG. 8 is a schematic diagram of another example embodiment of the disclosed standing wave oscillator.

As mentioned previously, in some examples the disclosed standing wave oscillator may be implemented as a single-ended implementation. FIG. 8 is a schematic diagram of another example disclosed standing wave oscillator 450. The example oscillator 450 is similar to the example oscillator 400 of FIG. 4, but the oscillator 450 of FIG. 8 has a single transmission line 410, and the gain stages 452, 454 are implemented using a suitable negative-resistance design (indicated as –R in FIG. 8) instead of cross-coupled inverters. The design considerations and advantages of the differential implementation described above may also generally apply to the single-ended implementation of FIG. 8. For example, there may be any even number of gain stages 452, 454, which may or may not be located symmetrically about the central line 420. The supply voltage $V_{DD}$ may be applied at one or both of the transmission line 410 to power the oscillator 400. The gain stages 452, 454 may employ any suitable transistors in any suitable negative-resistance configuration. The single transmission line 410 may be implemented as an LC ladder. Different circuit implementations of the gain stages 452, 454 may be used. The single-ended example oscillator 450 may be more sensitive to variations in the power supply, more sensitive to substrate noise and/or may require other downstream components (e.g., a mixer) to also be single-ended.

Thus, the present disclosure describes a design for a standing wave oscillator in which a lower phase noise may be achieved, and breakdown of transistors may be avoided. Transistor breakdown is of greater concern at lower gate lengths. Because shorter gate lengths are often useful for high frequency applications, the disclosed oscillators may be further advantageous in communication devices that are designed for smaller size and/or higher communication frequencies e.g., at 2.4 GHz or higher.

A standing wave oscillator, as disclosed herein, may be used to provide an oscillator signal for mixing antenna signals, in a receiver, transmitter or transceiver of a wireless communication device (e.g., in a clock generation circuit). For example, the disclosed oscillator may be tapped to provide an oscillator signal to a receiver, a transmitter or a transceiver. In some examples, the disclosed oscillator may be included in the receiver, transmitter or transceiver.

In some examples, the disclosed oscillator may have more than two gain stages. Generally, the oscillators disclosed herein may have any even number of gain stages, such that no gain stage is positioned at the location where the maximum voltage of the oscillator signal is expected to occur. For example, instead of two gain stages, an example oscillator may have four gain stages, which may be symmetrically positioned on either side of the central line of the oscillator. Increasing the number of gain stages in the oscillator may be helpful in decreasing phase noise.

In some examples, the even number of gain stages may not be symmetrically located about the central line of the oscillator. Where the gain stages are not symmetrically located on either side of the central line of the oscillator, the oscillator signal may be shifted such that the maximum occurs off-center. Where the gain stages are not symmetrically located about the central line, there may nonetheless be an equal number of gain stages on either side of the central line.

The disclosed oscillators may provide space savings, compared to prior art oscillators, because a fewer number of gain stages may be required (e.g., only two gain stages, compared to three gain stages in some prior art designs). The disclosed oscillators may provide performance equal to or better than prior art oscillators, without requiring significant increase in DC power consumption.

Further, the disclosed oscillators may provide increased flexibility in circuit layout and design, enabling the circuit to be designed with greater control over tradeoffs in phase noise, tuning range and DC power consumption.

The disclosed oscillators may be implemented using any suitable design for the gain stages, including implementation using any suitable transistors. For example, the disclosed oscillators may be implemented using bipolar transistors, such as bipolar junction transistors (BJTs) or heterojunction bipolar transistors (HBTs), or using field-effect transistors (FETs), such as MOSFETs, high-electron-mobility transistors (HEMTs) or metal-semiconductor field-effect transistors (MESFETs), among others.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, or a network device) to execute examples of the methods disclosed herein.

Certain adaptations and modifications of the described embodiments can be made. Therefore, the above discussed embodiments are considered to be illustrative and not restrictive. Although this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A standing wave oscillator comprising:
a transmission line; and
an even number of gain stages, each gain stage being connected to the transmission line, each gain stage being located at a respective location along a length of the transmission line;
the gain stages being configured to generate a standing wave oscillator signal along the length of the transmission line, when a supply voltage is applied to at least one end of the transmission line;
the location of each gain stage being non-coincidental with an expected location of maximum amplitude of the standing wave oscillator signal;
wherein the maximum amplitude of the standing wave oscillator signal, when a selected supply voltage is applied, is above a breakdown voltage of one or more transistors in one or more of the gain stages.

2. The standing wave oscillator of claim 1, comprising a pair of transmission lines, wherein each gain stage is connected across the pair of transmission lines, and wherein the pair of transmission lines are virtually grounded at each end.

3. The standing wave oscillator of claim 1, wherein each gain stage is located along the transmission line where an expected amplitude of the standing wave oscillator signal, when the selected supply voltage is applied, is at or below 90% of the breakdown voltage of the one or more transistors in each gain stage.

4. The standing wave oscillator of claim 1, wherein an equal number of one or more gain stages is located on either side of a central line of the standing wave oscillator.

5. The standing wave oscillator of claim 4, wherein the gain stages are located symmetrically on either side of the central line of the standing wave oscillator, wherein the central line is coincidental with the expected location of maximum amplitude of the standing wave oscillator signal; and wherein the standing wave oscillator signal exhibits a full 180° half-wave along the length of the transmission line.

6. The standing wave oscillator of claim 1, wherein there are two gain stages.

7. The standing wave oscillator of claim 1, wherein there are four gain stages.

8. The standing wave oscillator of claim 1, wherein the gain stages are all identical in circuit design.

9. The standing wave oscillator of claim 1, wherein the transmission line is implemented as an LC ladder.

10. The standing wave oscillator of claim 1, further comprising:
a varactor diode located at the expected location of the maximum amplitude of the standing wave oscillator signal.

11. A communication device comprising:
a transceiver for receiving or transmitting a communication signal;
a mixer for mixing the communication signal with an oscillator signal; and
a standing wave oscillator for providing the oscillator signal to the mixer, the oscillator signal being tapped from a selected location along the standing wave oscillator;
the standing wave oscillator including:
a transmission line; and
an even number of gain stages, each gain stage being connected to the transmission line, each gain stage being located at a respective location along a length of the transmission line;
the gain stages being configured to generate a standing wave oscillator signal along the length of the transmission line, when a supply voltage is applied to at least one end of the transmission line;
the location of each gain stage being non-coincidental with an expected location of maximum amplitude of the standing wave oscillator signal;
wherein the maximum amplitude of the standing wave oscillator signal, when a selected supply voltage is applied, is above a breakdown voltage of one or more transistors in one or more of the gain stages.

12. The communication device of claim 11, wherein the standing wave oscillator comprises a pair of transmission lines, wherein each gain stage is connected across the pair of transmission lines, and wherein the pair of transmission lines are virtually grounded at each end.

13. The communication device of claim 11, wherein each gain stage is located along the transmission line where an expected amplitude of the standing wave oscillator signal, when the selected supply voltage is applied, is at or below 90% of the breakdown voltage of the one or more transistors in each gain stage.

14. The communication device of claim 11, wherein an equal number of one or more gain stages is located on either side of a central line of the standing wave oscillator.

15. The communication device of claim 13, wherein the gain stages are located symmetrically on either side of the central line of the standing wave oscillator, wherein the central line is coincidental with the expected location of maximum amplitude of the standing wave oscillator signal; and wherein the standing wave oscillator signal exhibits a full 180° half-wave along the length of the transmission line.

16. The communication device of claim 11, wherein there are two gain stages in the standing wave oscillator.

17. The communication device of claim 11, wherein there are four gain stages in the standing wave oscillator.

18. The communication device of claim 11, wherein the gain stages are all identical in circuit design.

19. The communication device of claim 11, wherein the transmission line is implemented as an LC ladder.

20. The communication device of claim 11, wherein the standing wave oscillator further comprises:
a varactor diode located at the expected location of the maximum amplitude of the standing wave oscillator signal.

* * * * *